(12) United States Patent
Ehrmann

(10) Patent No.: US 7,190,730 B2
(45) Date of Patent: Mar. 13, 2007

(54) METHODS AND DEVICES FOR SENDING AND RECEIVING INFORMATION, AND SYSTEMS USING THEM

(75) Inventor: Frederique Ehrmann, Rennes (FR)

(73) Assignee: Canon Kabushiki Kaisha, Tokyo (JP)

( * ) Notice: Subject to any disclaimer, the term of this patent is extended or adjusted under 35 U.S.C. 154(b) by 572 days.

(21) Appl. No.: 09/785,780

(22) Filed: Feb. 16, 2001

(65) Prior Publication Data
US 2002/0071496 A1    Jun. 13, 2002

(30) Foreign Application Priority Data
Feb. 16, 2000 (FR) .................................. 00 01911

(51) Int. Cl.
*H04K 1/10* (2006.01)
*H04L 27/28* (2006.01)

(52) U.S. Cl. ....................... 375/260; 375/262; 375/265; 375/341

(58) Field of Classification Search ................ 375/260, 375/262, 265, 341, 295; 714/792, 794, 795; 370/208, 210, 312
See application file for complete search history.

(56) References Cited

U.S. PATENT DOCUMENTS

| | | | | |
|---|---|---|---|---|
| 4,980,897 | A * | 12/1990 | Decker et al. ............. | 375/265 |
| 5,191,576 | A * | 3/1993 | Pommier et al. ........... | 370/312 |
| 5,825,807 | A | 10/1998 | Kumar ....................... | 375/200 |
| 5,862,189 | A | 1/1999 | Huisken et al. ............ | 375/341 |
| 6,353,637 | B1 * | 3/2002 | Mansour et al. ........... | 375/260 |
| 6,877,125 | B2 | 4/2005 | Le Bars et al. ............ | 714/755 |
| 6,898,251 | B2 | 5/2005 | Le Bars et al. ............ | 375/295 |

(Continued)

FOREIGN PATENT DOCUMENTS

EP     0 589 709 A2    3/1994

(Continued)

OTHER PUBLICATIONS

Berrou C et al: "Digital Television: Hierarchical Channel Coding Using Turbo-Codes", International Conference on Communications (ICC) US, New York, IEEE, May 1, 1994, pp. 1255-1259.

(Continued)

*Primary Examiner*—Phuong Phu
(74) *Attorney, Agent, or Firm*—Fitzpatrick, Cella, Harper & Scinto

(57) ABSTRACT

An original information sequence is encoded by a use of an error correcting code. There is associated with the encoded sequence K frequency symbols in a space consisting of a series of $2^p$ increasing frequencies, each of the K symbols representing N encoded symbols, with p, K and N being strictly positive integers. There is applied to the K symbols a reversible transformation including a multiplication by an invertible matrix of size N×N, and signals obtained from the inverse transform signals are sent. There exists a K-tuplet of positive integers $n_1, n_2, \ldots, n_k$ at least one of which is strictly positive, such that, for an integer I varying from 1 to K, after periodic extraction of one frequency out of $2^{n_i}$ among the frequencies of the $i^{th}$ of the K symbols, thus forming a reduced frequency symbol of $2^{p-n_i}$ frequencies, K reduced frequency symbols are obtained, representing the original information sequence, with a view to complete or partial decoding.

58 Claims, 8 Drawing Sheets

U.S. PATENT DOCUMENTS

| | | |
|---|---|---|
| 6,996,170 B2 | 2/2006 | Thoumy et al. ............. 375/240 |
| 7,027,656 B2 | 4/2006 | Henry et al. ................ 382/239 |
| 2005/0138533 A1 | 6/2005 | Le Bars et al. ............. 714/784 |
| 2005/0185735 A1 | 8/2005 | Le Bars et al. ............. 375/295 |
| 2005/0188291 A1 | 8/2005 | Piret et al. .................. 714/752 |
| 2005/0204268 A1 | 9/2005 | Piret et al. .................. 714/781 |
| 2005/0257115 A1 | 11/2005 | Piret et al. .................. 714/752 |

FOREIGN PATENT DOCUMENTS

| | | |
|---|---|---|
| FR | 2 660 131 | 9/1991 |
| WO | WO 98/58496 | 12/1998 |

OTHER PUBLICATIONS

Keller et al: "Blind Detection Assisted Sub-Band Adaptive Turbo-Coded OFDM Schemes", IEEE Vehicular Technology Conference, May 16, 1999, XP-002144718, pp. 489-193.

Fernando W A C et al: "Performance of Turbo and Trellis Coded OFDM for Leo Satellite Channels in Global Mobile Communications", Atlanta, GA., Jun. 7-11, 1998, New York, IEEE, US., Conf. 5, Jun. 7, 1998 pp. 412-416

Jin Youn Kim: "Performance of OFDM/CDMA System With Turbo Coding in a Multipath Fading Channel", IEEE Transactions on Consumer Electronics, IEEE, New York, US, vol. 45, No. 2, May 1999, pp. 3721-3779.

Lin L et al: Turbo Codes for OFDM With Antenna Diversity, Houston, TX, May 16-20, 1999, New York, NY: IEEE, US, vol. Conf. 49, May 16, 1999, pp. 1664-1668.

Kaiser S et al: "Optimal Detection When Combining OFDM-CDMA With Convolutional and Turbo Channel Coding", IEEE International Conference on Communications (ICC), US, New York, IEEE, Jun. 23, 1996, pp. 343-348.

Berrou, C., et al. "Near Shannon Limit Error-Correcting Coding and Decoding: Turbo Codes (1)", ICC '93, Geneva., pp. 1064-1070.

\* cited by examiner

METHODS AND DEVICES FOR SENDING AND RECEIVING INFORMATION, AND SYSTEMS USING THEM

The present invention relates to a method and device for sending information, a method and device for receiving information, and systems using them.

In particular, the methods and devices of the present invention provide for a particular arrangement of the data output by a turbo-encoder, so as to enable a decoder using the Viterbi algorithm, or even a simple threshold decoder, to decode these data, whilst according to the prior art data output by a turbo-encoder require a turbodecoder in order to be decoded.

An information sending system generally sends symbols (each symbol being for example a sequence of binary data) in series over a transmission channel, thus occupying a frequency band which must necessarily be greater than the inverse of the duration of a symbol.

When the output of symbols becomes too high, it is impossible to guarantee that the transmission channel has amplitude and phase characteristics which are identical over the entire space of the frequencies making up the bandwidth. These distortions in the channel give rise to interference between symbols, which can be combated by means of an equaliser. However, such a system is relatively complex.

One technique for remedying this problem consists of distributing the signal to be transmitted over a large number of carriers in parallel, individually modulated at low rate. The rate being low, the bandwidth necessary for each carrier is smaller, and therefore it is more probable that the amplitude and phase characteristics will be identical for all the frequencies constituting this band. This technique is known to persons skilled in the art as orthogonal frequency division multiplexing or OFDM. This is because the spectra of the signals modulating the sub-carriers overlap so that they satisfy the condition of orthogonality which makes it possible to eliminate interference between modulated sub-carriers and to obtain a much greater spectral efficiency.

The spacing between two adjacent sub-carriers corresponds to the inverse of the duration of a symbol.

OFDM modulation is generally assimilated to a Fourier transform, so that, to implement it, Fast Fourier Transform (FFT) algorithms are used.

The main steps performed during the sending of a message by means of an OFDM modulation are set out below.

First of all the binary data of the message to be sent are grouped in blocks of data. Each of these blocks will be transmitted independently and will constitute, after base band modulation, an OFDM symbol.

In each of these blocks of data, the binary elements are also grouped together by sub-set, each sub-set then undergoing a bijective mapping on a discrete set of points in the Fresnel space, each of these points representing a possible phase and amplitude. Thus, for example, if a message is considered consisting of the following series of bits: {00001110010001111000. . . }, a block of 16 bits 0000111001000111 can be extracted therefrom, with which there is associated, by mapping, the set of points according to the complex plane: 1+j, 1+j, −1−j, 1−j, −1+j, 1+j, −1+j, −1−j. There is therefore a set of elements, defining a vector U1.

There is then applied to the vectors U1 thus obtained from the original message a fast inverse discrete Fourier transform of matrix A1, which supplies an OFDM symbol, consisting of a series of complex amplitudes.

Each OFDM symbol transmitted is received, after passing through the transmission channel, by a receiver, from which there is extracted a vector V2 containing complex elements by multiplying the amplitudes constituting this OFDM symbol by a direct discrete Fourier transform matrix A2, such that A1.A2 =I, where I designates the identity matrix.

The application of a decision criterion based on the maximum likelihood on the real part and imaginary part of the components of each vector V2 makes it possible to find the initial sequence of symbols, and then to restore the associated binary elements.

The different symbols of each block are linked together because of the linear combination obtained by multiplying the elements of a vector U1 to be transmitted by the inverse discrete Fourier transform matrix A1. This linear combination guarantees a certain robustness and protects the symbols against interference between complex symbols within the same OFDM symbol.

On the other hand, this protection effect does not extend from one OFDM symbol (that is to say a block of complex symbols) to the other.

To prevent interference between blocks, it is known that a technique can be used which consists of providing a period of silence or non-transmission, also referred to as a guard time, between two consecutive symbols.

In addition, in order to improve the reliability of the transmission system, an encoding using turbocodes is advantageously added to the OFDM modulation. This type of encoding has in fact, compared with the usual conventional encoding methods, the following advantage: the number of uncorrected errors decreases very rapidly for a slight increase in the signal to noise ratio.

A conventional turbo-encoder consists of two recursive systematic convolutional (RSC) encoders and an interleaver, disposed as shown in FIG. 1. The turbo-encoder outputs three series of binary elements (x, y1, y2), where x is the so-called systematic output of the turbo-encoder, that is to say one which has not undergone any processing compared with the input signal x, y1 is the output encoded by the first RSC encoder, and y2 is the output encoded by the second RSC encoder after passing through the interleaver.

For more details on turbocodes, reference can usefully be made to the article by C. Berrou, A. Glavieux and P. Thitimajshima entitled "Near Shannon limit error-correcting coding and decoding: turbo-codes", ICC '93, Geneva.

FIG. 2 depicts an example of a conventional turbodecoder able to decode data supplied by a turbo-encoder like the one in FIG. 1. The inputs x, y1, y2 of the turbodecoder are the outputs of the turbo-encoder as received by the decoder after passing through the transmission channel, assumed here to be ideal in order to facilitate the description. The structure of such a turbodecoder is well known to persons skilled in the art and will therefore not be described in detail here.

It is clear, according to FIG. 2, that a turbodecoder has the drawback of having a very complex structure.

In particular it requires two decoders, designated "Decoder 1" and "Decoder 2" in FIG. 2, for example of the BCJR type, that is to say using the Bahl, Cocke, Jelinek and Raviv algorithm, or of the SOVA ("Soft Output Viterbi Algorithm") type.

A conventional turbodecoder also requires a looping back of the output of the deinterleaver $\pi 2$ onto the input of the first decoder, in order to transmit the so-called "extrinsic" information from the second decoder to the first decoder.

The purpose of the present invention is to remedy the aforementioned drawbacks.

For this purpose, the present invention proposes a method of sending an original information sequence, including:

an encoding operation, consisting of encoding the original information sequence by means of an error correction code, so as to obtain a sequence of encoded symbols;

a frequency mapping operation, consisting of associating with the sequence of encoded symbols K frequency symbols in a frequency space consisting of an ordered series of $2^p$ increasing frequencies, periodically spaced apart and associated with an amplitude, each of the K frequency symbols representing N encoded symbols, p, K and N being strictly positive integers;

an inverse transformation operation, consisting of applying to the K frequency symbols a reversible transformation including a multiplication by an invertible matrix of size N×N, so as to obtain inverse transform signals; and a transmission operation, consisting of sending over a transmission channel signals obtained from the inverse transform signals; this transmission method being remarkable in that there exists a K-tuplet of positive integers $n_1, n_2, \ldots, n_K$, at least one of which is strictly positive, such that, for an integer i varying from 1 to K, after periodic extraction of one frequency out of $2^{n_i}$ amongst the frequencies of the $i^{th}$ of the K frequency symbols, thus forming a reduced frequency symbol with $2^{p-n_i}$ frequencies, a set of K reduced frequency symbols is obtained, representing the original information sequence, with a view to a complete or partial decoding.

Thus the invention makes it possible to judiciously order the data issuing from a turbo-encoder by using at the transmitter a particular frequency mapping system before an OFDM modulation.

According to a variant, there exists a strictly positive integer n such that, after periodic extraction of one frequency out of $2^n$ amongst the frequencies of each of the K frequency symbols, thus forming a reduced frequency symbol with $2^{p-n}$ frequencies, a set of K reduced frequency symbols is obtained, representing the original information sequence.

This variant is simpler than the previous embodiment, since there is a single granularity value n and, in addition, all the K reduced frequency symbols have the same size, which means that, on reception, all the reversible transformations applied, the inverse of the transformations applied on transmission during the aforementioned inverse transformation operation, will also be of the same size.

According to a particular characteristic, the encoding operation includes at least one recursive systematic convolutional encoding operation.

This characteristic has the advantages inherent in error correcting encoding.

According to a particular characteristic, the encoding operation is a turbo-encoding operation.

This characteristic has the advantages inherent in turbocodes and notably of procuring better protection for the data and the fact that the number of uncorrected errors decreases very rapidly for a slight increase in the signal to noise ratio.

According to a particular characteristic, the inverse transformation operation is an inverse fast discrete Fourier transformation.

It is thus possible to benefit from the FFT (Fast Fourier Transform) algorithm, fast and of high performance.

According to a particular characteristic, the original information sequence having a length $\ell$, a value of N is chosen which is both a power of 2 and equal to $4\ell$.

Having a symbol length which is a multiple of a power of 2 makes it possible to directly use the FFT algorithm without being preoccupied with supplementing the symbols with an appropriate technique such as adding zeros or "zero padding". The value $4\ell$ results from the way in which the FFT functions, namely the possibility of dividing its size by 2 or 4, in particular embodiments where the transmitter has a turbo-encoder with two or three parities.

In more general terms, designs can be envisaged in which the transmitter has a turbo-encoder with more than three parities; in this case, the blocks of sub-carriers have a number of sub-carriers equal to any power of 2. The multiplying factor of $\ell$ is related, generally speaking, to the values of $n_i$ or n defined above.

According to a particular characteristic, the encoding operation is a turbo-encoding operation with two parities and, during the frequency mapping operation, for each block of four successive frequencies, corresponding respectively to four sub-carriers:

the systematic output obtained at the end of the turbo-encoding operation is associated with the first available sub-carrier, in the sense of the lowest frequency in the block;

the output with the second parity obtained at the end of the turbo-encoding operation is associated with the second sub-carrier in the block;

the output with the first parity obtained at the end of the turbo-encoding operation is associated with the third sub-carrier in the block; and the systematic output is also associated with the fourth available sub-carrier, in the sense of the highest frequency in the block.

Thus the outputs of the turbo-encoder are placed judiciously, so as to be able to easily recover, on reception, the outputs of interest according to the size of the FFT chosen. Making the systematic output appear twice makes it possible on the one hand to optimally exploit the available frequencies and on the other hand to better protect the systematic output with a view to its correct recovery on reception.

According to a particular characteristic, the encoding operation is a turbo-encoding operation with three parities and, during the frequency mapping operation, for each block of four successive frequencies, corresponding respectively to four sub-carriers:

the systematic output obtained at the end of the turbo-encoding operation is associated with the first available sub-carrier, in the sense of the lowest frequency in the block;

the output with the second parity obtained at the end of the turbo-encoding operation is associated with the second sub-carrier in the block;

the output with the first parity obtained at the end of the turbo-encoding operation is associated with the third sub-carrier in the block; and the output with the third parity obtained at the end of the turbo-encoding operation is associated with the fourth available sub-carrier, in the sense of the highest frequency in the block.

It is possible here to use all the frequencies of each block without repeating an output of the turbo-encoder.

According to a particular characteristic, the transmission method uses a modulation of the OFDM type, which has the advantages mentioned in the introduction.

For the same purpose as indicated above, the present invention also proposes a device for sending an original information sequence, having:

- an encoding module, for encoding the original information sequence by means of an error correction code, so as to obtain a sequence of encoded symbols;
- a frequency mapping module, for associating with the sequence of encoded symbols K frequency symbols in a frequency space consisting of an ordered sequence of $2^p$ increasing frequencies periodically spaced apart and associated with an amplitude, each of the K frequency symbols representing N encoded symbols, p, K and N being strictly positive integers;
- an inverse transformation module, for applying to the K frequency symbols a reversible transformation including a multiplication by an invertible matrix with a size N×N, so as to obtain inverse transform signals; and
- a transmission module, for sending over a transmission channel signals obtained from the inverse transform signals;

this transmission device being remarkable in that there exists a K-tuplet of positive integers $n_1, n_2, \ldots, n_K$, at least one of which is strictly positive, such that, for an integer i varying from 1 to K, after periodic extraction of one frequency out of $2^{n_i}$ amongst the frequencies of the $i^{th}$ of the K frequency symbols, thus forming a reduced frequency symbol with $2^{p-n_i}$ frequencies, a set of K reduced frequency symbols is obtained, representing the original information sequence, with a view to a complete or partial decoding.

The particular characteristics and the advantages of the transmission device being the same as those of the transmission method, they are not repeated here.

Still for the same purpose, the present invention also proposes a method of receiving signals representing an original information sequence sent by means of a transmission method as above, remarkable in that, from a K-tuplet of granularity equal to positive integers $n'_1, n'_2, \ldots, n'_K$ such that each integer $n'_i$ is less than or equal to said integer $n_i$, this reception method includes:

- an operation of receiving K frequency symbols sent by means of the aforementioned transmission method;
- an extraction operation consisting, for each integer i varying from 1 to K, of periodically extracting one frequency out of $2^{n'_i}$ amongst the frequencies of the $i^{th}$ of the K frequency symbols received, thus forming a reduced frequency symbol with $2^{p-n'_i}$ frequencies;
- a transformation operation consisting, for each integer i varying from 1 to K, of applying to this reduced frequency symbol with $2^{p-n'_i}$ frequencies, a reversible transformation including a multiplication by an invertible matrix of size $2^{p-n'_i} \times 2^{p-n'_i}$; and
- an operation of decoding all the K reduced frequency symbols with $2^{p-n'_i}$ frequencies, thus forming a decoded information sequence.

A granularity of n corresponds to the periodic extraction of one frequency out of $2^n$ frequencies.

Such a reception method makes it possible to dispense with the need to demodulate the received symbols with an FFT of the same size as the IFFT ("Inverse Fast Fourier Transform") used on transmission.

According to a particular characteristic, the K-tuplet of granularity is determined during a choosing operation.

This makes it possible to define the K-tuplet of granularity, either once and for all, or adaptively, according to the state of the transmission channel.

According to a variant, the original information sequence having been sent by means of a transmission method according to the variant succinctly disclosed above, the reception method is remarkable in that, from a granularity equal to a positive integer n' less than or equal to said integer n, it includes:

- an operation of receiving K frequency symbols sent by means of the aforementioned transmission method;
- an extraction operation, consisting of periodically extracting one sequence out of $2^{n'}$ amongst the frequencies of each of the K frequency symbols received, thus forming a reduced frequency symbol with $2^{p-n'}$ frequencies;
- a transformation operation, consisting of applying, to each of the K reduced frequency symbols with $2^{p-n'}$ frequencies, a reversible transformation including a multiplication by an invertible matrix of size $2^{p-n'} \times 2^{p-n'}$; and
- an operation of decoding all the K reduced frequency symbols with $2^{p-n'}$ frequencies, thus forming a decoded information sequence.

This variant is simpler than the previous embodiment, since the granularity is reduced to a single value for all the symbols.

According to a particular characteristic, the granularity is determined during a choosing operation.

This characteristic has the same advantages as in the case where there is a K-tuplet of granularity.

According to a particular characteristic, the choosing operation consists of choosing the granularity which are all the larger, the better the reception quality.

Thus, the better the reception quality, the fewer frequencies are taken in each symbol, and consequently the shorter the FFT and therefore the simpler and faster the implementation.

According to a particular characteristic, the choosing operation consists of choosing the granularity from a look-up table giving the possible granularity values as a function of signal to noise ratios.

Such a look-up table affords an appreciable saving in time; it makes it possible to achieve an adaptive system in which the granularity value or values are chosen as a function of the measured value of the signal to noise ratio. It also affords a saving in terms of physical production, given that a smaller number of operations are performed.

According to a particular characteristic, the choosing operation consists of choosing the granularity from a look-up table giving the possible granularity values as a function of the distance between a transmitter using a transmission method as above and a receiver using the reception method of the invention.

The look-up table has advantages similar to the above look-up table.

According to a particular characteristic, the transformation operation is a direct fast discrete Fourier transformation operation.

This characteristic has the same advantages as the use of an inverse fast discrete Fourier transformation on transmission.

According to a particular characteristic, the decoding operation consists of decoding the set of reduced frequency symbols in accordance with a decoding technique which is a function of the granularity.

It is thus possible to reduce the complexity of the reception by virtue of the values of the granularity: the larger these are, the simpler the decoder.

Thus the decoding operation can be either a turbodecoding operation or a Viterbi decoding operation or a threshold decoding operation.

Still for the same purpose, the present invention also proposes a device for receiving signals representing an original information sequence transmitted by a transmission device as above, remarkable in that, from a K-tuplet of granularity equal to positive integers $n'_1, n'_2, \ldots, n'_K$ such that each integer $n'_i$ is less than or equal to said integer $n_i$, this reception device has:

- a transformation module, for applying, for each integer i varying from 1 to K, to the reduced frequency symbol with $2^{p-n'_i}$ frequencies, a reversible transformation including a multiplication by an invertible matrix of size $2^{p-n'_i} \times 2^{p-n'_i}$; and
- a decoding module for decoding all the K reduced frequency symbols with $2^{p-n'_i}$ frequencies, thus forming a decoded information sequence.

The particular characteristics and advantages of the reception device being the same as those of the reception method, they are not repeated here.

The present invention also relates to a digital signal processing apparatus, having means adapted to implement an information transmission method and/or an information reception method as above.

The present invention also relates to a digital signal processing apparatus, having an information transmission device and/or an information reception device as above.

The present invention also relates to a telecommunication network, having means adapted to implement an information transmission method and/or an information reception method as above.

The present invention also relates to a telecommunication network having an information transmission device and/or an information reception device as above.

The present invention also relates to a mobile station in a telecommunication network, having means adapted to implement an information transmission method and/or an information reception method as above.

The present invention also relates to a mobile station in a telecommunication network having an information transmission device and/or an information reception device as above.

The invention also relates to:

- an information storage means which can be read by a computer or microprocessor storing instructions of a computer program, for implementing an information transmission method and/or an information reception method as above, and
- an information storage means which is removable, partially or totally, and which can be read by a computer or microprocessor storing instructions of a computer program, for implementing an information transmission method and/or an information reception method as above.

The invention also relates to a computer program product comprising software code portions for implementing an information transmission method and/or an information reception method as above.

The particular characteristics and advantages of the different digital signal processing apparatus, the different telecommunication networks, the different mobile stations, the information storage means and the computer program product being the same as those of the transmission and reception method according to the invention, these particular characteristics and advantages are not repeated here.

Other aspects and advantages of the invention will emerge from a reading of the following detailed description of particular embodiments, given by way of non-limitative examples. The description refers to the drawings which accompany it, in which:

FIG. 1, already described, depicts schematically the structure of a conventional turbo-encoder;

FIG. 2, already described, depicts schematically the structure of a conventional turbodecoder;

The invention is described here, in no way limitatively, in its particular application to OFDM modulation.

Figure 1:
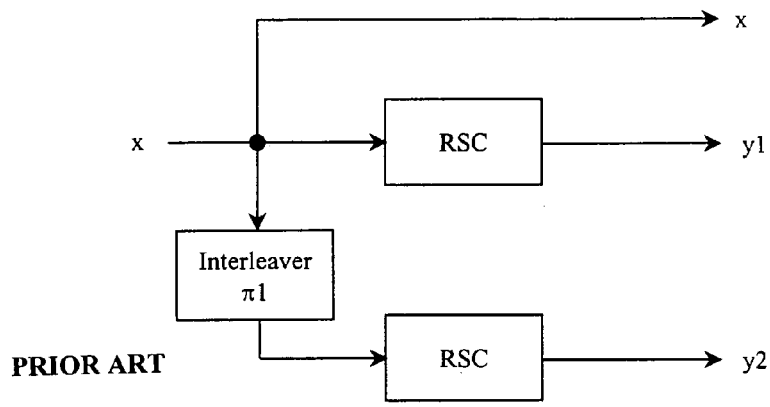
Figure 2:
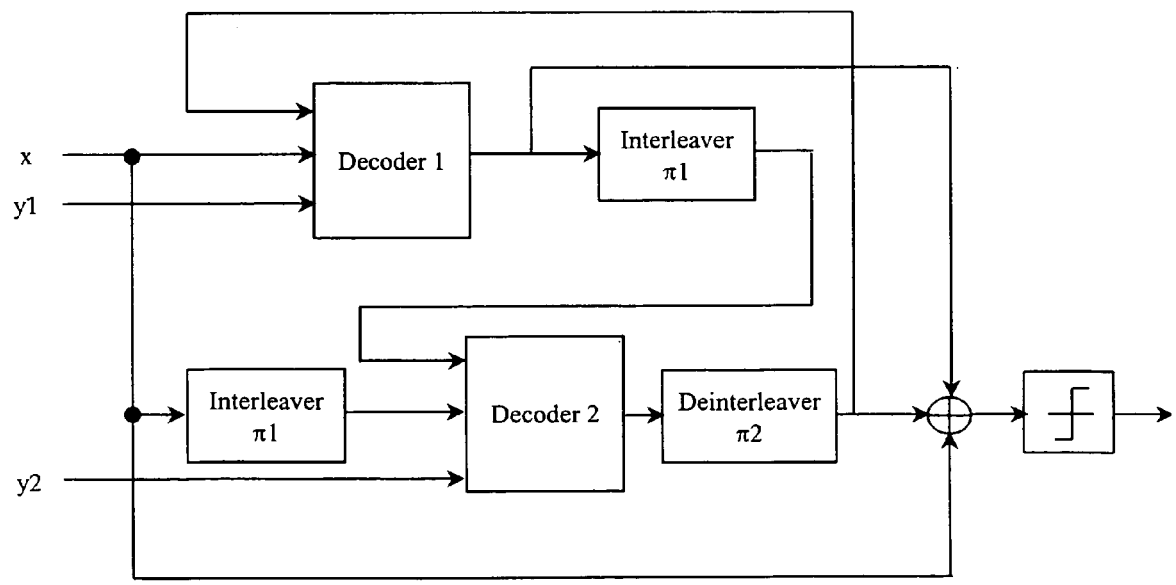
Figure 3:
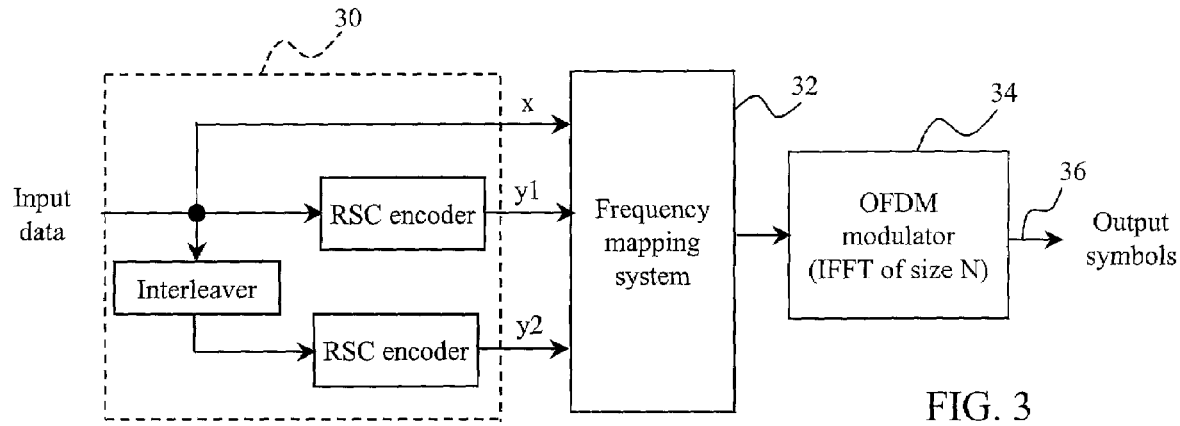
FIG. 3 depicts schematically the structure of a transmission device according to the present invention, in a particular embodiment in which the invention uses a turbo-encoder with two parities.

As shown in FIG. 3, a transmission device according to the present invention has an encoding module 30 intended to encode the input data by means of an error correcting code. The module 30 can for example be a turbo-encoder with two parities, consisting of two systematic recursive convolutional encoders and an interleaver, such as the one in FIG. 1. The interleaver used can for example be of the type described in the patent document FR-A-2 773 287. The module 30 has a systematic output x, an output corresponding to the first parity y1 and an output corresponding to the second parity y2.

The three sequences of encoded symbols x, y1, y2 are supplied as an input to a frequency mapping system 32, which sequences them and places them in a particular manner on the sub-carriers of the spectrum available in order to constitute frequency symbols.

Figure 7:
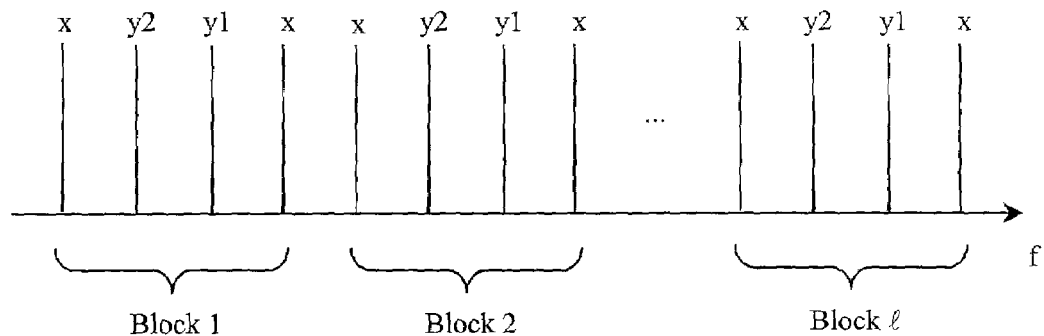
FIG. 7 depicts schematically, in the frequency space, the sequencing of the outputs of a turbo-encoder with two parities on the different sub-carriers available, before the application of the reversible transformation at the time of transmission, in accordance with the transmission method of the invention, in the particular embodiment of FIG. 3.

This particular sequencing and arrangement are illustrated in FIG. 7, which is a schematic representation of the frequency space f. This space consists of an ordered sequence of $2^p$ increasing frequencies, spaced apart periodically and associated with an amplitude, p being a strictly positive integer.

Let $\ell$ be the length of the input sequence x.

In the particular embodiment described here, an OFDM modulation of size N is used, N being a strictly positive integer. Advantageously a value of N is chosen which is both a power of 2 and equal to $4\ell$.

To each block of 4 frequencies, corresponding respectively to 4 subcarriers, the quadruplet (x,y2,y1,x) is applied.

Thus, in each block:
- the systematic output x is placed on the first available sub-carrier, in the sense of the lowest frequency in the block,
- the output the second RSC encoder y2, after interleaving, is placed on the following available sub-carrier, that is to say the second in the block,
- the output of the first RSC encoder y1 is placed on the third available sub-carrier, and
- the fourth available sub-carrier, in the sense of the highest frequency in the block, is used for repeating the systematic output x.

This distribution is repeated for all the $\ell$ blocks of 4 sub-carriers of the available spectrum.

The transmission device in FIG. 3 also has, at the output of the frequency mapping system 32, an OFDM modulator 34. The OFDM modulator 34 applies to the frequency symbols supplied by the frequency mapping system 32 a reversible transformation including notably an operation of multiplication by an invertible matrix of size N×N. By way of an in no way limitative example, this transformation can be an inverse fast discrete Fourier transformation of size N.

A transmission module 36, not shown in detail, transmits over a transmission channel signals obtained from the inverse Fourier transform signals, after having applied to them conventional modulation and filtering processes, well known to persons skilled in the art, and possibly a transposed band modulation.

Figure 4:
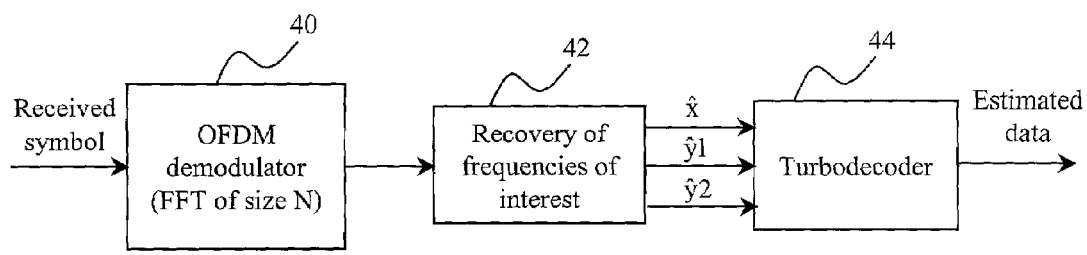
FIGS. 4 to 6 depict schematically the structure of a reception device according to the present invention, respectively in a particular embodiment in which the invention uses a turbodecoder, in a first variant embodiment in which the invention uses a Viterbi decoder and in a second variant in which the invention uses a threshold decoder.

FIG. 4 depicts schematically the structure of a reception device according to the present invention in a first embodiment. The reception device of FIG. 4 has notably a conventional turbodecoder 44.

The symbols received are supplied as an input to a first OFDM demodulator 40, which applies to them a transformation which is the reverse of that applied on transmission. In the example described here, this transformation, during reception, is a direct fast discrete Fourier transformation.

In this first embodiment, the demodulator 40 applies a Fourier transformation of size N to the received symbols.

The reception device of FIG. 4 also has a first module for recovering the frequencies of interest 42, which has a parallel/serial converter function for recovering firstly the frequencies carrying the systematic outputs x, secondly those carrying the outputs of the first RSC encoder y1, and finally those carrying the outputs of the second RSC encoder after interleaving, y2.

The outputs of the module 42 are supplied as an input to the turbodecoder 44, which estimates the sequence actually sent.

Figure 5:
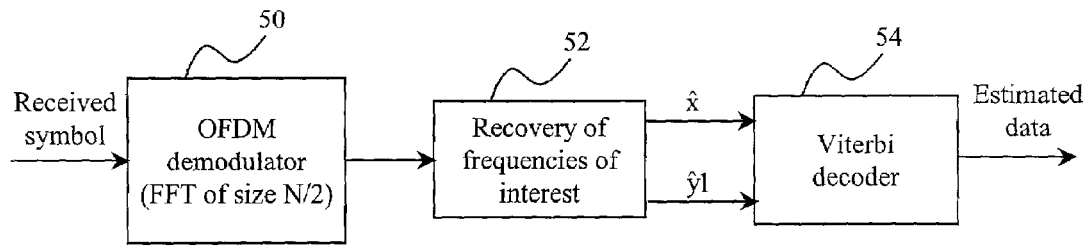

FIG. 5 depicts schematically the structure of a reception device according to the present invention in a variant embodiment. The reception device of FIG. 5 has notably a conventional Viterbi decoder 54.

Figure 8:
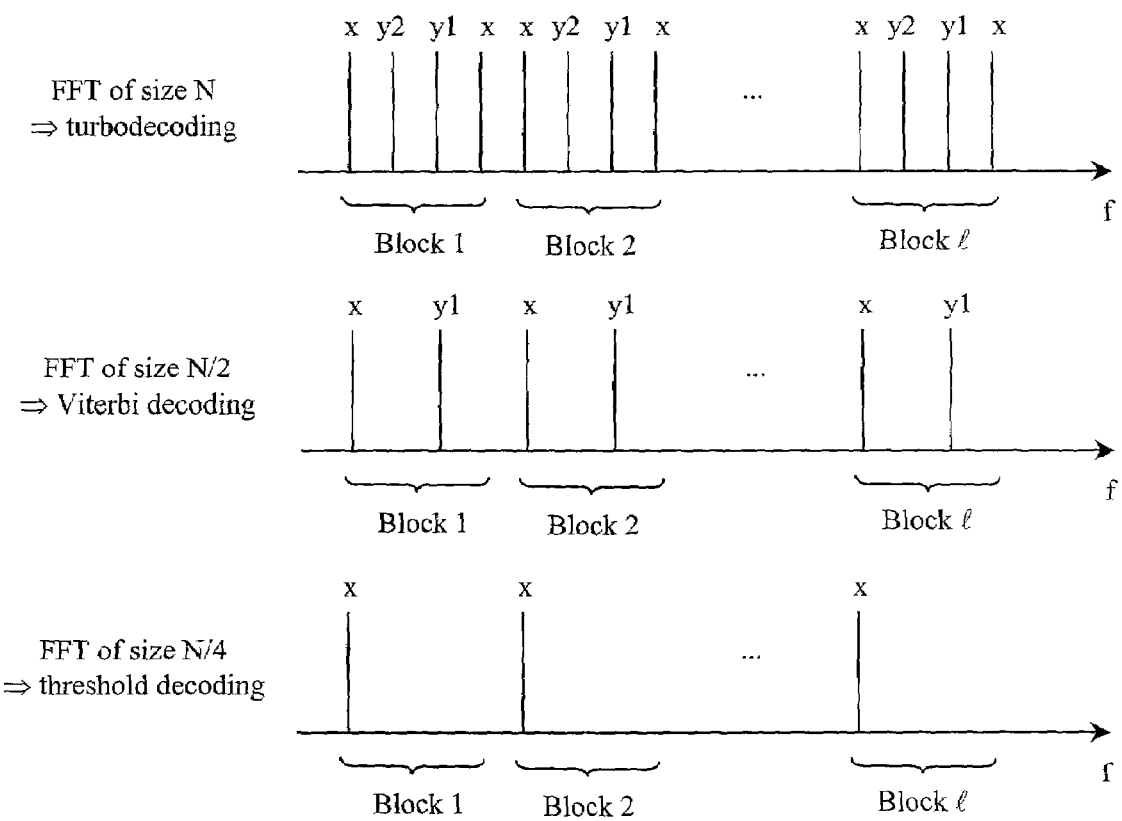
FIG. 8 depicts schematically, in the frequency space, the method of recovering the outputs of a turbo-encoder with two parities, after application of the reversible transformation on reception, in three particular embodiments, as a function of the size of this transformation, and shows the type of decoding used.

The symbols received are supplied as an input to a second OFDM demodulator 50, which applies to them a direct fast discrete Fourier transformation of size N/2. For this, as shown by FIG. 8, the demodulator 50 periodically extracts one frequency out of two amongst the frequencies of each frequency symbol, thus forming a reduced frequency block with two frequencies: the one carrying the systematic output x and the one carrying the output of the first RSC encoder y1. A set of reduced frequency symbols representing the input sequence is therefore obtained.

The reception device of FIG. 5 also has a second module for recovering the frequencies of interest 52 which, in a similar manner to the first module for recovering the frequencies of interest 42 of FIG. 4, recovers on the one hand the frequencies carrying the systematic outputs x and on the other hand those carrying the outputs of the first RSC coder y1.

The outputs of the module 52 are supplied as an input to the Viterbi decoder 54, which estimates the sequence actually sent.

Figure 6:
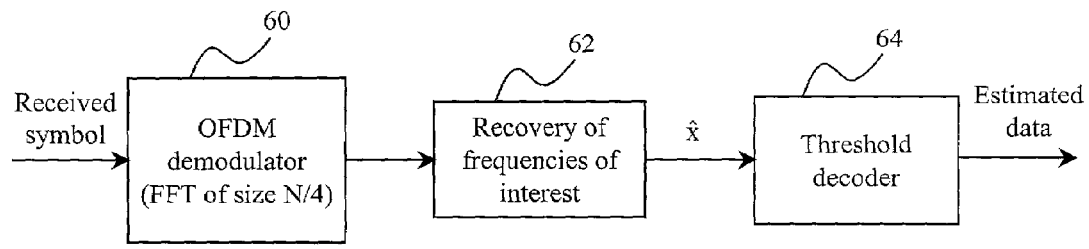

FIG. 6 depicts schematically the structure of a reception device according to the present invention in another variant embodiment. The reception device of FIG. 6 includes notably a conventional threshold decoder 64.

The symbols received are supplied as an input to a third OFDM demodulator 60, which applies to them a direct fast discrete Fourier transformation of size N/4. For this, as shown by FIG. 8, the demodulator 60 periodically extracts one frequency out of four amongst the frequencies of each frequency symbol, thus forming a frequency block reduced to one frequency: the one carrying the systematic output x. A set of reduced frequency symbols representing the input sequence is therefore obtained.

The device of FIG. 6 also has a third module for recovering the frequencies of interest 62 which, in fact, recovers all the frequencies issuing from the demodulator 60, which all carry the systematic output x.

The output of the module 62 is supplied as an input to the threshold decoder 64, which estimates the sequence actually sent.

If the receiver is situated close to the transmitter, which is generally the case, for example, when the transmitter is a PC (Personal Computer) and the receiver is a printer close to the PC, it is not necessary to use a turbodecoder during reception. The reception device is then of the type illustrated in FIG. 5, or even of the type illustrated in FIG. 6, that is to say the direct fast discrete Fourier transformation applied is of size N/2, or even respectively N/4, and the decoder used is a Viterbi decoder, or even respectively a simple threshold decoder.

On the other hand, if the receiver is distant from the transmitter, which is generally the case, for example, when the transmitter is a PC and the receiver is a server distant from the PC, the reception device will advantageously be chosen of the type illustrated in FIG. 4, that is to say the direct fast discrete Fourier transformation applied is of size N, in order to provide a turbodecoding of the data.

Thus, in accordance with the present invention, it is possible to provide a receiver of lesser cost on certain items of equipment where it is known in advance that they will be close to the sender and keep the circuits which are more complex, and therefore more expensive, for the equipment for which this is really useful.

More generally, if it is considered that the frequency mapping system supplies K frequency symbols, K being a strictly positive integer, it is possible to extract a number of frequencies which is different in each of these K symbols.

The invention is generalised as follows: there exists a K-tuplet of positive integers $n_1, n_2, \ldots, n_K$ at least one of which is strictly positive, such as for an integer i varying from 1 to K, after periodic extraction of one frequency out of $2^{n_i}$ amongst the frequencies of the $i^{th}$ of the K frequency symbols, thus forming a reduced frequency symbol with $2^{p-n_i}$ frequencies, there is obtained a set of K reduced frequency symbols representing the original information sequence.

It is possible to choose a strictly positive integer $n_1 = n_2 = \ldots = n_K = n$ so as to extract the same number of frequencies for all the frequency symbols. Thus, after periodic extraction of one frequency out of $2^n$ amongst the frequencies of each of the K frequency symbols, thus forming a reduced frequency symbol with $2^{p-n}$ frequencies, all the K reduced frequency symbols are obtained.

The size of the inverse fast discrete Fourier transformation applied on sending is N. Let the size of the direct fast discrete Fourier transformation applied on reception be denoted $2^{p-n'_i}$, $n'_i$ being a positive integer. The maximum value of $n'_i$ is the integer $n_i$ defined previously, associated with the $i^{th}$ of the K frequency symbols.

Thus a K-tuplet of granularities $n'_1, n'_2, \ldots, n'_K$ is chosen, positive integers respectively less than or equal to the integers $n_1, \ldots, n_2, \ldots, n_K$.

In a particular embodiment, these granularities are chosen so as to be greater, the better the reception quality.

For example, they can be chosen from a look-up table giving the possible granularity values as a function of signal to noise ratios.

As a variant, the granularities can be chosen from a look-up table giving the possible granularity values as a function of the distance between sender and receiver, as described above.

Then all the reduced frequency symbols are decoded in accordance with a technique of decoding as a function of the granularities.

If the same number of frequencies are extracted from all the frequency symbols, that is to say if $n_1 = n_2 = \ldots = n_K = n$, the K-tuplet of granularities $n'_1, n'_2, \ldots, n'_K$ is reduced to a single value $n' \leq n$ and, on reception, a direct fast discrete Fourier transformation of size $2^{p-n'}$ is applied.

Figure 9:
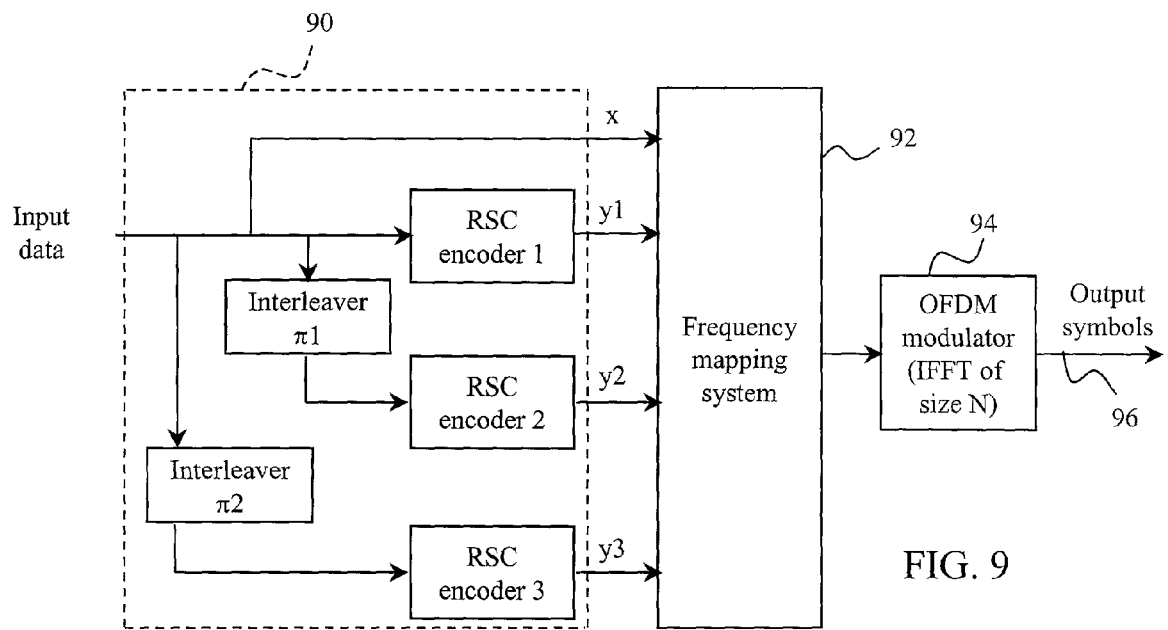
FIG. 9 depicts schematically the structure of a transmission device according to the present invention, in a particular embodiment in which the invention uses a turbo-encoder with three parities.

FIG. 9 illustrates a variant of the sending device of FIG. 3, in which the encoding module 90 is a turbo-encoder with three parities, consisting of three systematic recursive convolutional encoders (denoted "RSC encoder 1", "RSC encoder 2" and "RSC encoder 3" in FIG. 9) and two interleavers (denoted "Interleaver π1" and "Interleaver π2" in FIG. 9).

The module 90 has a systematic output x, an output corresponding to the first parity y1, an output corresponding to the second parity y2 and an output corresponding to the third parity y3.

Figure 10:
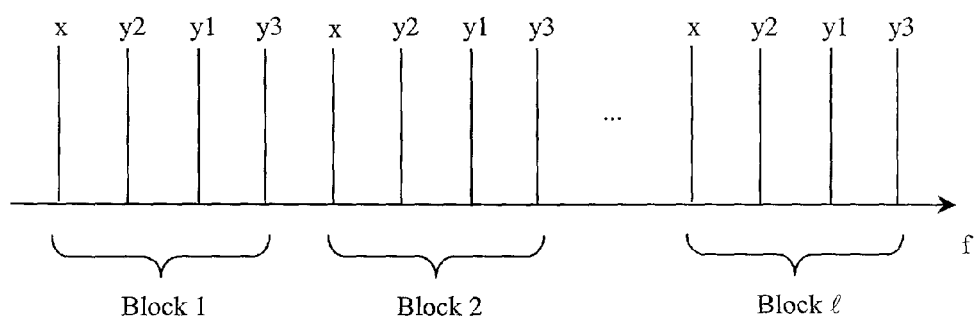
FIG. 10 depicts schematically, in the frequency space, the sequencing of the outputs of a turbo-encoder with three parities on the different sub-carriers available, before the application of the reversible transformation on transmission, in accordance with the transmission method of the invention, in the particular embodiment of FIG. 9.

The four sequences of encoded symbols x, y1, y2, y3 are supplied as an input to a frequency mapping system 92, which orders them and places them on the sub-carriers of the available spectrum as shown in FIG. 10: for each block of four sub-carriers, the systematic output x is placed on the first available sub-carrier, in the sense of the lowest frequency of the block, the output of the second RSC encoder y2, after interleaving, is placed on the following available sub-carrier, that is to say the second in the block, the output of the first RSC encoder y1 is placed on the third available sub-carrier, that is to say the third in the block, and the fourth available sub-carrier, in the sense of the highest frequency in the block, is used for the output of the third RSC encoder y3.

This distribution is repeated for all the $\ell$ blocks of 4 sub-carriers of the available spectrum.

The sending device of FIG. 9 also has, at the output of the frequency mapping system 92, an OFDM modulator 94. The OFDM modulator 94 applies, to the frequency symbols supplied by the frequency mapping system 92, an inverse fast discrete Fourier transformation of size N.

A sending module 96, not shown in detail, sends over a transmission channel signals obtained from the inverse Fourier transform signals, after having applied to them conventional modulation and filtering processings, well known to persons skilled in the art, and possibly a transposed band modulation.

Figure 11:
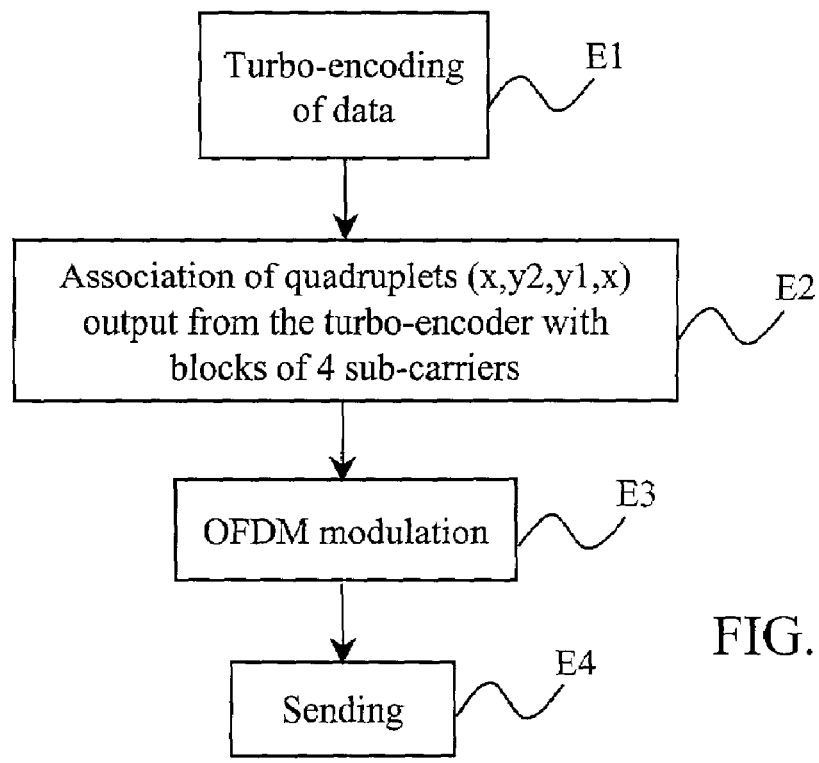
FIG. 11 is a flow diagram illustrating the successive steps of the transmission method of the invention, in a particular embodiment in which the invention uses a turbo-encoder with two parities.

The flow diagram of FIG. 11 illustrates the successive steps of the sending method of the invention, in a particular embodiment in which the sender has a turbo-encoder with two parities, as is the case with the sending device described above with the help of FIG. 3.

During a first step E1, the data to be transmitted are encoded by means of an error correction code, so as to obtain a sequence of encoded symbols. To this end, it is for example possible to effect a turbo-encoding of the data by means of a two-parity turbo-encoder of efficiency ⅓.

There is therefore obtained at the end of step E1 a series of encoded symbols corresponding to the systematic output x, a series of encoded symbols corresponding to the first parity y1 and a series of encoded symbols corresponding to the second parity y2.

During the following step E2, a mapping operation in the frequency space is performed, which consists of associating with each quadruplet (x,y2,y1,x) a block of 4 sub-carriers.

In this way the frequency spectrum is constructed as a succession of $\ell$ blocks of 4 sub-carriers, as illustrated in FIG. 7 described above.

Then, at step E3, an inverse transformation operation is performed, which consists of applying to the frequency symbols obtained at the end of step E2 a reversible transformation including a multiplication by an invertible matrix of size N×N. This transformation can for example be an inverse fast discrete Fourier transformation of size N, the value of N advantageously being chosen so as to be both a power of 2 and equal to $4\ell$. At the end of step E3, OFDM symbols are obtained, which are then sent, during step E4, over a transmission channel.

Figure 12:
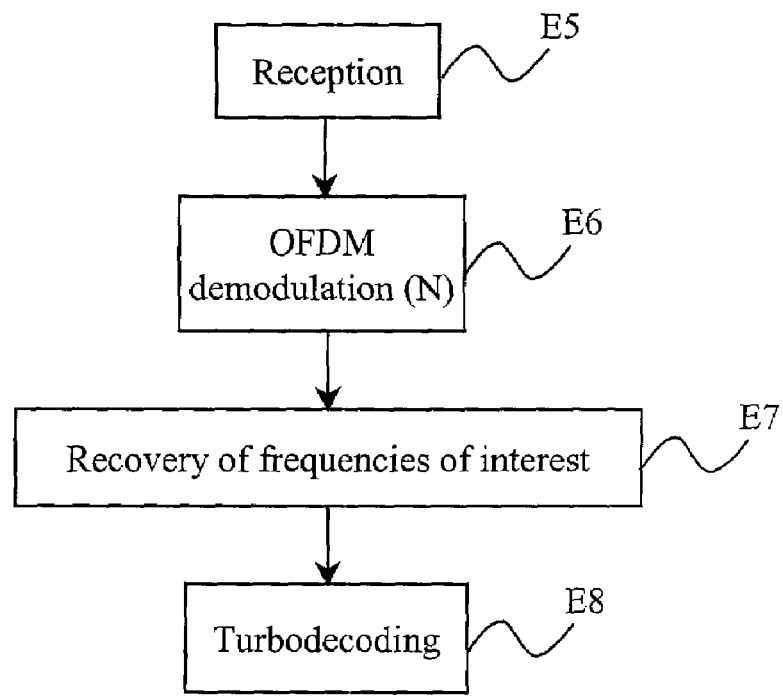
FIG. 12 is a flow diagram illustrating the successive steps of the reception method of the invention, in a particular embodiment in which it is chosen to decode the data received by means of a turbodecoder.

The flow diagram of FIG. 12 illustrates the successive steps of the reception method of the invention, adapted to decode data sent by means of a sending method such as the one described with the help of FIG. 11, in a particular embodiment in which it is chosen to decode the data by turbodecoding.

A first step E5 consists of receiving the data sent by the sender, in the form of OFDM symbols.

These symbols are then demodulated during a step E6, by the application of a transformation which is the reverse of that used on sending, namely, in the non-limitative example described here, a direct fast discrete Fourier transformation. In the embodiment in FIG. 12, given that turbodecoding has been chosen as the decoding technique, it is necessary for the Fourier transformation applied to be of size N.

Next, a step E7 makes it possible to recover the frequencies of interest, that is to say, respectively, those carrying the systematic outputs x, those carrying the first parities y1 and those carrying the second parities y2.

Finally, step E8 consists of effecting a turbodecoding of the received data obtained at the end of step E7. This turbodecoding operation is conventional and is therefore not detailed here.

Figure 13:
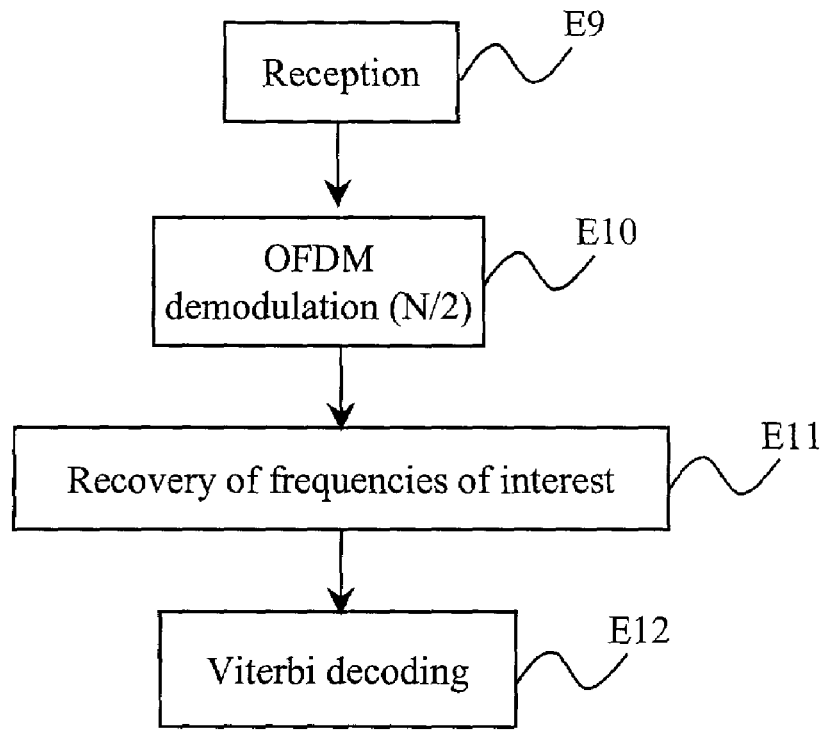
FIG. 13 is a flow diagram illustrating the successive steps of the reception method of the invention, in a first variant in which it is chosen to decode the data received by means of a Viterbi decoder.

The flow diagram of FIG. 13 illustrates the successive steps of the reception method of the invention, adapted to decode data sent by means of a sending method such as the one described with the help of FIG. 11, in a particular embodiment in which it is chosen to decode the data by Viterbi decoding.

The reception step E9 is similar to step E5 of FIG. 12.

The following step E10, like step E6 of FIG. 12, consists of applying a direct fast discrete Fourier transformation to the received data. However, given that Viterbi decoding has been chosen as the decoding technique, it suffices for the transformation applied to be here of size N/2.

The following step E11, like step E7 of FIG. 12, consists of recovering the frequencies of interest, that is to say here those carrying the systematic outputs x and those carrying the first parities y1.

Finally, step E12 consists of effecting a Viterbi decoding of the received data obtained at the end of step E11. This Viterbi decoding operation is conventional and is therefore not detailed here.

Figure 14:
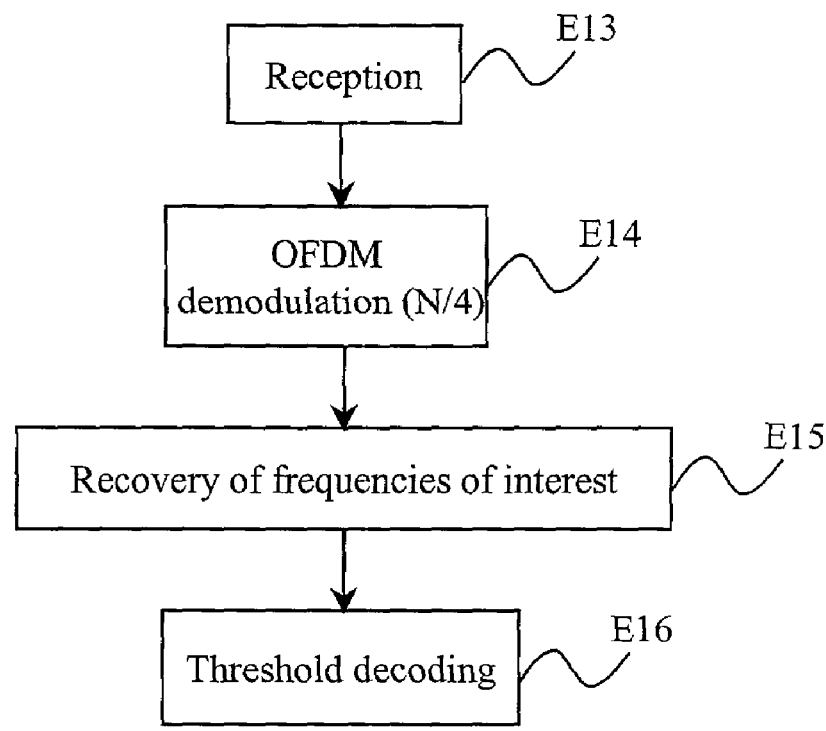
FIG. 14 is a flow diagram illustrating the successive steps of the reception method of the invention, in a second variant in which it is chosen to decode the data received by means of a threshold decoder.

The flow diagram of FIG. 14 illustrates the successive steps of the reception method of the invention, adapted to decode data sent by means of a sending method like the one described with the help of FIG. 11, in a particular embodiment in which it is chosen to decode the data by threshold decoding.

The reception step E13 is similar to step E5 of FIG. 12.

The following step E14, like step E6 of FIG. 12, consists of applying a direct fast discrete Fourier transformation to the received data. However, given that threshold decoding has been chosen as the decoding technique, it suffices for the transformation applied here to be of size N/4.

The following step E15, like step E7 of FIG. 12, consists of recovering the frequencies of interest, which amounts here to collecting in series all the frequencies issuing from the OFDM demodulation operation E14, since all the frequencies carry the systematic outputs x.

Finally, step E16 consists of effecting a threshold decoding of the received data obtained at the end of step E15. This threshold decoding operation is conventional and is therefore not detailed here.

The reception methods illustrated in FIGS. 12, 13 and 14 can be generalised in the form of the following succession of steps, in the light of the concept of granularity and the notations introduced above:

an operation of receiving K frequency symbols;
an extraction operation consisting, for each integer i varying from 1 to K, of periodically extracting one frequency out of $2^{n'_i}$ amongst the frequencies of the $i^{th}$ of the K frequency symbols received, thus forming a frequency symbol reduced to $2^{p-n'_i}$ frequencies;
a transformation operation consisting, for each integer i varying from 1 to K, of applying to the reduced frequency symbol with $2^{p-n'_i}$ frequencies, a reversible transformation including a multiplication by an invertible matrix of size $2^{p-n'_i} \times 2^{p-n'_i}$; and
an operation of decoding the set of K reduced frequency symbols with $2^{p-n'_i}$ frequencies, thus forming a decoded information sequence.

In the particular embodiment of FIG. 12, $n'_1 = n'_2 = \ldots = n'_K = 0$.

In the particular embodiment of FIG. 13, $n'_1 = n'_2 = \ldots = n'_K = 1$.

In the particular embodiment of FIG. 14, $n'_1 = n'_2 = \ldots = n'_K = 2$.

Figure 15:
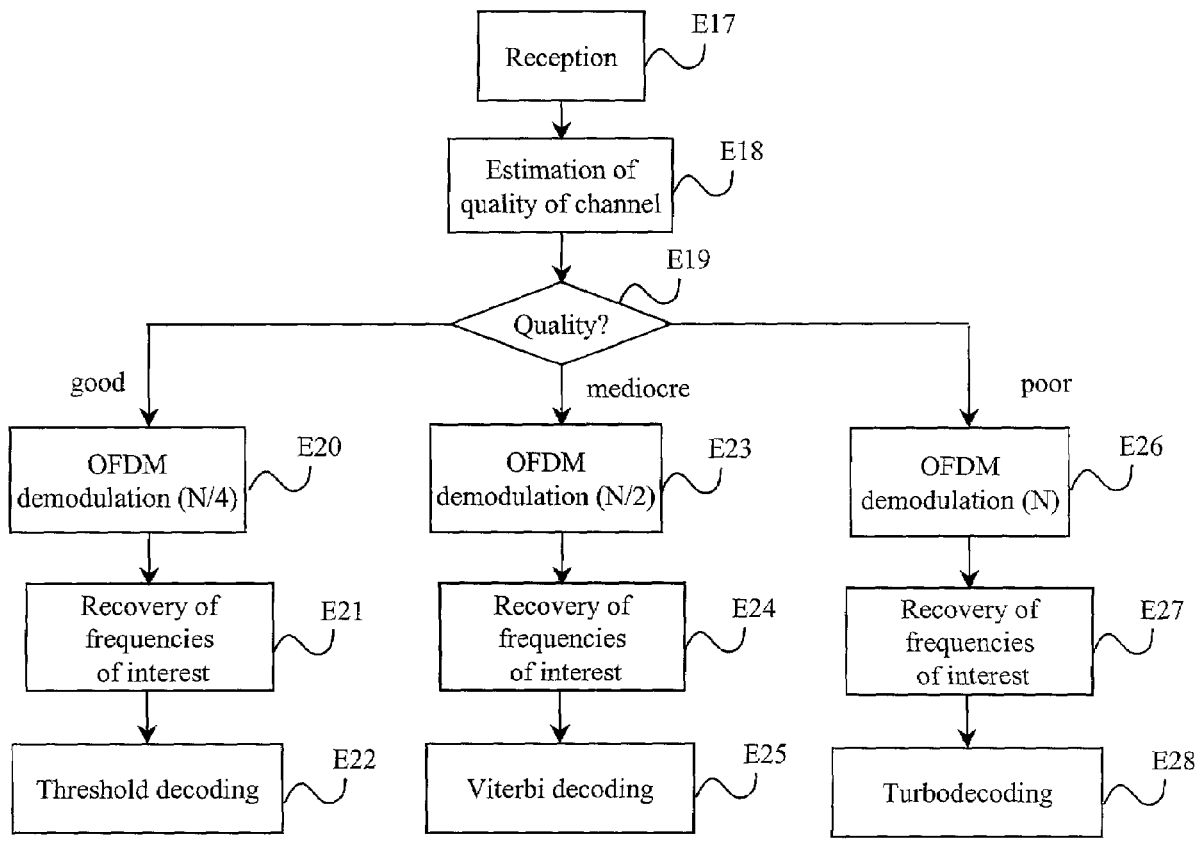
FIG. 15 is a flow diagram illustrating the successive steps of the reception method of the invention, in a third variant in which the quality of the transmission channel is taken into account.

The flow diagram of FIG. 15 illustrates the steps of the reception method of the invention, adapted to decode data sent by means of a sending method like the one described with the help of FIG. 11, in a variant embodiment in which the quality of the transmission channel is taken into account.

The reception step E17 is similar to step E5 of FIG. 12.

It is followed by a step E18 consisting of estimating the quality of the transmission channel. This conventional operation can be performed, for example, using the measurement of the signal to noise ratio, or using the measurement of the distance between the sender and receiver.

Then test E19 consists of choosing the decoding technique best suited according to the estimation of the quality of the channel made at step E18:

if the quality of the channel is good, steps E20, E21 and E22 are performed, respectively identical to steps E14, E15 and E16 of FIG. 14, that is to say the direct fast discrete Fourier transform is of size N/4 and the decoding used is a threshold decoding;
if the quality of the channel is mediocre, steps E23, E24 and E25 are performed, respectively identical to steps E10, E11 and E12 of FIG. 13, that is to say the direct fast discrete Fourier transformation is of size N/2 and the decoding used is a Viterbi decoding;
if the quality of the channel is poor, steps E26, E27 and E28 are performed, respectively identical to steps E6, E7 and E8 of FIG. 12, that is to say the direct fast discrete Fourier transformation is of size N and the decoding used is a turbodecoding.

Thus the values of $n'_i$ previously defined, which determine the size of the direct fast discrete Fourier transformation to be applied on reception, are chosen so as to be the greater, the better the reception quality.

For example, a look-up table may have been established in advance, giving the values of possible granularities as a function of the signal to noise ratios, or a look-up table giving the possible granularity values as a function of the distance between sender and receiver.

Figure 16:
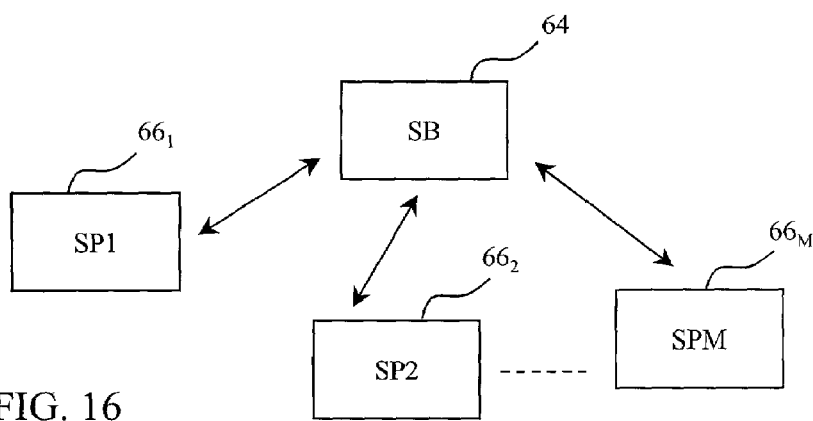
FIG. 16 is a simplified schematic view of a wireless telecommunication network, for example of the type in accordance with the ETSI draft HiperLan2, capable of implementing the invention.

As shown by FIG. 16, a network according to the invention consists of a so-called base station SB designated by the reference 64, and several peripheral stations SPi, i=1, ..., M, M being an integer greater than or equal to 1, respectively designated by the references $66_1$, $66_2$, ..., $66_M$. The peripheral stations $66_1$, $66_2$, ..., $66_M$ are remote from the base station SB, each connected by a radio link with the base station SB and able to move with respect to the latter.

Figure 17:
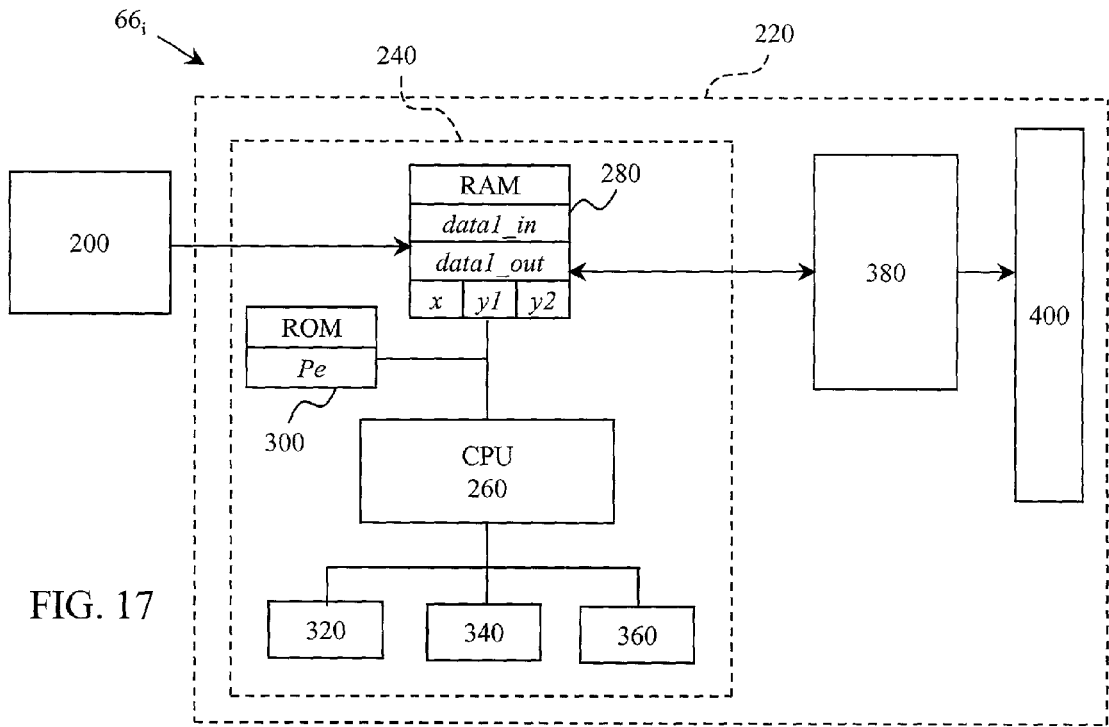
FIG. 17 is a schematic representation of a peripheral station in a network such as the one in FIG. 16, used for transmission and capable of implementing the invention.

The block diagram of FIG. 17 depicts a more detailed view of a peripheral station SPi, i=1, ..., M according to the invention, which comprises a data source 200 and a sending device 220.

The peripheral station SPi has for example a digital camera, a computer, a printer, a server, a facsimile machine, a scanner or a digital photographic apparatus.

The sending device 220 comprises a data processing unit 240 comprising a calculation unit CPU (Central Processing Unit) 260, a temporary data storage means 280 (RAM), a data storage means 300 (ROM), character entry means 320, such as a keyboard for example, image retrieval means 340 such as a screen for example, and input/output means 360.

The RAM 280 contains, in different registers:
input data "data1_in", coming from the data source 200;
output data "data1_out", obtained at the end of the sending method of the invention; and
current elements of the series of bits x, y1, y2 coming from the turbo-encoder, in a particular embodiment in which the turbo-encoder has two parities.

The peripheral station SPi also comprises a sending unit 380 and a radio module 400 having a known sender with one or more modulators, filters and a radio antenna (not shown).

The sending device 220, by virtue of the program "Pe", stored in the ROM 300, and whose sequence of instructions corresponds to the steps of the sending method of the invention, is able to execute the steps of the sending method illustrated in FIG. 11.

Figure 18:
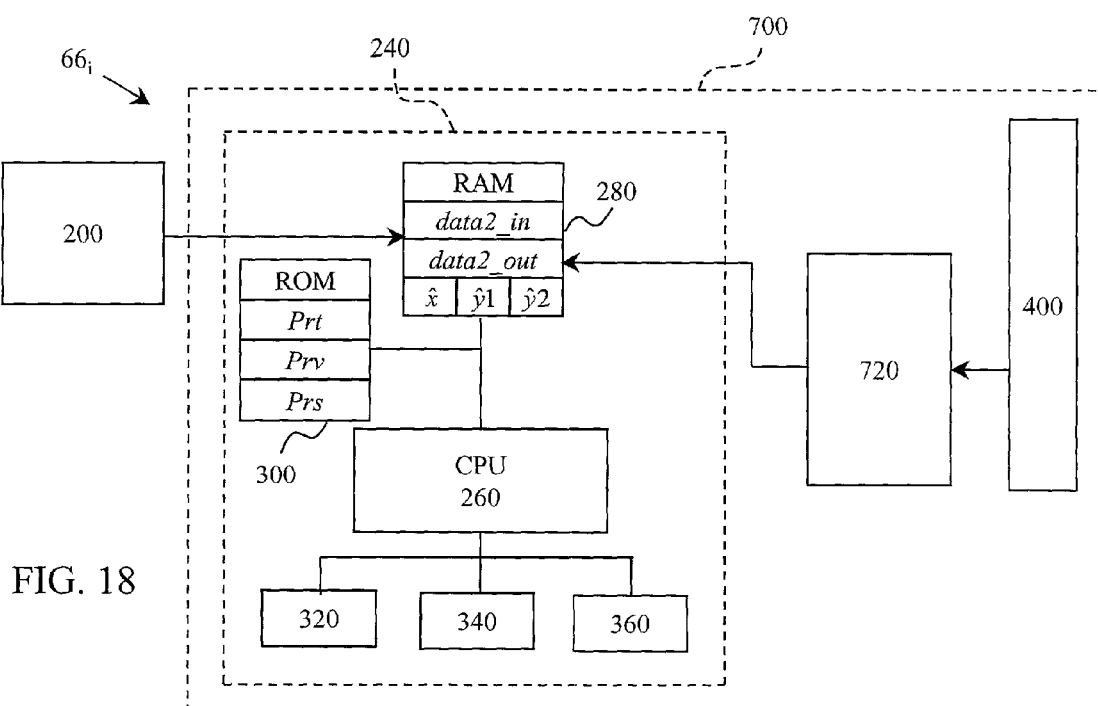
FIG. 18 is a schematic representation of a peripheral station in a network such as the one in FIG. 16, used for reception and capable of implementing the invention.

The peripheral station SPi according to the invention also comprises, as shown in FIG. 18, a reception device 700 consisting of a data processing unit corresponding to the data processing unit 240 already described with reference to FIG. 17, a reception unit 720 and a radio module 400 with its antenna as depicted in FIG. 17.

In the reception device 700, the RAM 280 contains, in different registers:
input data "data2_in", coming from the sender, after passing through a transmission channel;
output data "data2_out", obtained at the end of the reception method of the invention in any one of its embodiments; and
the estimates $\hat{x},\hat{y}1,\hat{y}2$ corresponding to the current elements of the series of bits x, y1, y2 which come from the turbo-encoder used by the sender, if the FFT has recovered them, which depends on the size chosen for this FFT.

The reception device 700, by virtue of the programs "Prt", "Prv" and "Prs" stored in the ROM 300 and whose sequences of instructions correspond respectively to the steps of the reception methods of the invention with turbodecoding (for "Prt"), with Viterbi decoding (for "Prv") and with threshold decoding (for "Prs") is able to execute indifferently, either the steps of the reception method with turbodecoding illustrated in FIG. 12, or the steps of the reception method with Viterbi decoding illustrated in FIG. 13, or the steps of the reception method with threshold decoding illustrated in FIG. 14.

The invention as described above can be implemented equally well on so-called base stations, in a centralised-architecture network, or on stations in a distributed-architecture network.

The invention claimed is:

1. A method of sending an original information sequence, including:
an encoding operation, of encoding the original information sequence by means of an error correction code, so as to obtain a sequence of encoded symbols;
a frequency mapping operation, of associating with the sequence of encoded symbols K frequency symbols in a frequency space consisting of an ordered series of $2^p$ increasing frequencies, periodically spaced apart and associated with an amplitude, each of the K frequency symbols representing N encoded symbols, p, K and N being strictly positive integers;
an inverse transformation operation, of applying to the K frequency symbols a reversible transformation including a multiplication by an invertible matrix of size N×N, so as to obtain inverse transform signals; and
a transmission operation, of sending over a transmission channel signals obtained from the inverse transform signals in which there exists a K-tuplet of positive integers $n_1, n_2, \ldots, n_K$, at least one of which is strictly positive, such that, for an integer i varying from 1 to K, after periodic extraction of one frequency out of $2^{n_i}$ amongst the frequencies of the $i^{th}$ of the K frequency symbols, thus forming a reduced frequency symbol with $2^{p-n_i}$ frequencies, a set of K reduced frequency symbols is obtained, representing the original information sequence, with a view to a complete or partial decoding.

2. The method according to claim 1, in which there exists a strictly positive integer n such that, after periodic extraction of one frequency out of $2^n$ amongst the frequencies of each of the K frequency symbols, thus forming a reduced frequency symbol with $2^{p-n}$ frequencies, there is obtained a set of K reduced frequency symbols representing the original information sequence.

3. The method according to claim 1 or 2, characterised in that said encoding operation includes at least one systematic recursive convolutional encoding operation.

4. The method according to claim 1 or 2, in which said encoding operation is a turbo-encoding operation.

5. The method according to claim 1 or 2, in which said reverse transformation operation is an inverse fast discrete Fourier transformation operation.

6. The method according to claim 1 or 2, in which the original information sequence has a length $\ell$, in which a value of N is chosen which is both a power of 2 and equal to $4\ell$.

7. The method according to claim 1 or 2, in which said encoding operation is a turbo-encoding operation with two parities and, during said frequency mapping operation, for each block of four successive frequencies, corresponding respectively to four sub-carriers:
a systematic output (x) obtained at the end of the turbo-encoding operation is associated with a first available sub-carrier, in the sense of the lowest frequency in the block;
an output with a second parity (y2) obtained at the end of the turbo-encoding operation is associated with a second sub-carrier in the block;

an output with a first parity (y1) obtained at the end of the turbo-encoding operation is associated with a third sub-carrier in the block; and the systematic output (x) is also associated with a fourth available sub-carrier, in the sense of the highest frequency in the block.

8. The method according to claim 1 or 2, in which said encoding operation is a turbo-encoding operation with three parities and, during said frequency mapping operation, for each block of four successive frequencies, corresponding respectively to four sub-carriers:

a systematic output (x) obtained at the end of the turbo-encoding operation is associated with a first available sub-carrier, in the sense of the lowest frequency in the block;

an output with a second parity (y2) obtained at the end of the turbo-encoding operation is associated with a second sub-carrier in the block;

an output with the first parity (y1) obtained at the end of the turbo-encoding operation is associated with a third sub-carrier in the block; and an output with a third parity (y3) obtained at the end of the turbo-encoding operation is associated with a fourth available sub-carrier, in the sense of the highest frequency in the block.

9. The method according to claim 1 or 2, in which a modulation of the OFDM type is used.

10. A device for sending an original information sequence, having:

encoding means, for encoding the original information sequence by means of an error correction code, so as to obtain a sequence of coded symbols;

frequency mapping means, for associating with the sequence of encoded symbols K frequency symbols in a frequency space consisting of an ordered sequence of $2^p$ increasing frequencies periodically spaced apart and associated with an amplitude, each of the K frequency symbols representing N encoded symbols, p, K and N being strictly positive integers;

inverse transformation means, for applying to the K frequency symbols a reversible transformation including a multiplication by an invertible matrix with a size N×N, so as to obtain inverse transform signals; and transmission means, for sending over a transmission channel signals obtained from the inverse transform signals in which there exists a K-tuplet of positive integers $n_1, n_2, \ldots, n_k$, at least one of which is strictly positive, such that, for an integer i varying from 1 to K, after periodic extraction of one frequency out of $2^{ni}$ amongst the frequencies of the $i^{th}$ of the K frequency symbols, thus forming a reduced frequency symbol with $2^{p-ni}$ frequencies, a set of K reduced frequency symbols is obtained, representing the original information sequence, with a view to a complete or partial decoding.

11. The device according to claim 10, in which there exists a strictly positive integer n such that, after periodic extraction of one frequency out of $2^n$ amongst the frequencies of each of the K frequency symbols, thus forming a reduced frequency symbol with $2^{p-n}$ frequencies, there is obtained a set of K reduced frequency symbols representing the original information sequence.

12. The device according to claim 10 or 11, in which said encoding means includes at least first systematic recursive convolutional encoding means.

13. The device according to claim 10 or 11, in which said encoding means comprises turbo-encoding means.

14. The device according to claim 10 or 11, in which said reverse transformation means comprises inverse fast discrete Fourier transformation means.

15. The device according to claim 10 or 11, in which the original information sequence has a length l, characterised in that, for said predetermined number (N), a value is chosen which is both a power of 2 and equal to 4l.

16. The device according to claim 10 or 11, in which said encoding means comprise turbo-encoding means with two parities and said frequency mapping means associate, for each block of four successive frequencies, corresponding respectively to four sub-carriers:

a systematic output (x) of said turbo-encoding means with a first available sub-carrier, in the sense of the lowest frequency in the block;

an output with a second parity (y2) of said turbo-encoding means with a second sub-carrier in the block;

an output with a first parity (y1) of said turbo-encoding means with a third sub-carrier in the block; and the systematic output (x) also with a fourth available sub-carrier, in the sense of the highest frequency in the block.

17. The device according to claim 10 or 11, in which said encoding means comprises turbo-encoding means with three parities and said frequency mapping means associates, for each block of four frequencies, corresponding respectively to four sub-carriers:

a systematic output (x) of said turbo-encoding means with a first available sub-carrier, in the sense of the lowest frequency in the block;

an output with a second parity (y2) of said turbo-encoding means with a second sub-carrier in the block;

an output with a first parity (y1) of said turbo-encoding means with a third sub-carrier in the block; and an output with a third parity (y3) of said turbo-encoding means with a fourth available sub-carrier, in the sense of the highest frequency in the block.

18. The device according to claim 10 or 11, in which a modulation of the OFDM type is used.

19. A method of receiving signals representing an original information sequence sent by means of a transmission method according to claim 1 or 2, in which, from a K-tuplet of granularity equal to positive integers $n'_1, n'_2, \ldots, n'_K$ such that each integer $n'_i$, is less than or equal to the integer $n_i$, said reception method includes:

an operation, of receiving the K frequency symbols sent by means of said transmission method;

an extraction operation, for each integer i varying from 1 to K, of periodically extracting one frequency out of $2^{n'_i}$ amongst the frequencies of the $i^{th}$ of the K frequency symbols received, thus forming a reduced frequency symbol with $2^{p-n'_i}$ frequencies;

a transformation operation, for each integer i varying from 1 to K, of applying to the reduced frequency symbol with $2^{p-n'_i}$ frequencies, a reversible transformation including a multiplication by an invertible matrix of size $2^{p-n'_i} \times 2^{p-n'_i}$; and an operation, of decoding all the K reduced frequency symbols with $2^{p-n'_i}$ frequencies, thus forming a decoded information sequence.

20. The reception method according to claim 19, in which the K-tuplet of granularity is determined during a choosing operation.

21. The reception method according to claim 19, the original information sequence having been sent by means of a sending method according to claim 2, in which, from a granularity equal to a positive integer n' less than or equal to said integer n, said reception method includes:
- an operation, of receiving K frequency symbols sent by means of said transmission method;
- an extraction operation, of periodically extracting one sequence out of $2^{n'}$ amongst the frequencies of each of the K frequency symbols received, thus forming a reduced frequency symbol with $2^{p-n'}$ frequencies;
- a transformation operation, of applying, to each of the K reduced frequency symbols with $2^{p-n'}$ frequencies, a reversible transformation including a multiplication by an invertible matrix of size $2^{p-n'} \times 2^{p-n'}$; and
- an operation, of decoding all the K reduced frequency symbols with $2^{p-n'}$ frequencies, thus forming a decoded information sequence.

22. The reception method according to claim 21, in which said granularity is determined during a choosing operation.

23. The reception method according to claim 20, in which said choosing operation includes choosing said granularity so as to be the greater, the better the reception quality.

24. The reception method according to claim 20, in which said choosing operation includes choosing said granularity from a look-up table giving possible granularity values as a function of signal to noise ratios.

25. The reception method according to claim 19, in which said transformation operation is a direct fast discrete Fourier transformation operation.

26. The reception method according to claim 19, in which said decoding operation includes decoding the set of reduced frequency symbols according to a decoding technique which is a function of said granularity.

27. The reception method according to claim 19, in which said decoding operation is a turbo-decoding operation.

28. The reception method according to claim 19, in which said decoding operation is a Viterbi decoding operation.

29. The reception method according to claim 19, in which said decoding operation is a threshold decoding operation.

30. A device for receiving signals representing an original information sequence sent by a sending device according to claim 10 or 11, in which, from a K-tuplet of granularity equal to positive integers $n'_1, n'_2, \ldots, n'_k$ such that each integer $n'_i$ is less than or equal to the integer $n_i$, said reception device has:
- transformation means, for applying, for each integer i varying from I to K, to the reduced frequency symbol with $2^{p-n'i}$ frequencies, a reversible transformation including a multiplication by an invertible matrix of size $2^{p-n'i} \times 2^{p-n'i}$; and
- decoding means for decoding all the K reduced frequency symbols with $2^{p-n'i}$ frequencies, thus forming a decoded information sequence.

31. The device according to claim 30, in which said K-tuplet of granularity is determined using choosing means.

32. The device according to claim 31, in which said choosing means choose said granularity so as to be the greater, the better the reception quality.

33. The device according to claim 31, in which said choosing means choose said granularity from a look-up table giving possible granularity values as a function of signal to noise ratios.

34. The device according to claim 31, in which said choosing means choose said granularity from a look-up table giving possible granularity values as a function of a distance between a sender having a sending device according to any one of claims 10 to 18 and a receiver having said reception device.

35. The device according to claim 30, in which said transformation means comprise direct fast discrete Fourier transformation means.

36. The device according to claim 30, in which said decoding means decode the set of reduced frequency symbols according to a decoding technique which is a function of said granularity.

37. The device according to claim 30, in which said decoding means comprise turbo-decoding means.

38. The device according to claim 30, in which said decoding means comprise Viterbi decoding means.

39. The device according to claim 30, in which said decoding means comprise threshold decoding means.

40. A digital signal processing apparatus, having means adapted to implement a sending method according to claim 1 or 2.

41. A digital signal processing apparatus, having means adapted to implement a reception method according to claim 19.

42. A digital signal processing apparatus, having a sending device according to claim 10 or 11.

43. A digital signal processing apparatus, having a reception device according to claim 30.

44. A telecommunications network, having means adapted to implement a sending method according to claim 1 or 2.

45. A telecommunications network, having means adapted to implement a reception method according to claim 19.

46. A telecommunications network, having a sending device according to claim 10 or 11.

47. A telecommunications network, having an information reception device according to claim 30.

48. A mobile station in a telecommunications network, having means adapted to implement a sending method according to claim 1 or 2.

49. A mobile station in a telecommunications network, having means adapted to implement a reception method according to claim 19.

50. A mobile station in a telecommunications network, having a sending device according to claim 10 or 11.

51. A mobile station in a telecommunications network, having a reception device according to claim 30.

52. Information storage means which can be read by a computer or microprocessor storing instructions of a computer program, in which said information storage means implements a sending method according to claim 1 or 2.

53. Information storage means which can be read by a computer or microprocessor storing instructions of a computer program, in which said information storage means implements a reception method according to claim 19.

54. Information storage means which is removable, partially or totally, and which can be read by a computer or microprocessor storing instructions of a computer program, in which said information storage means implements a sending method according to claim 1 or 2.

55. Information storage means which is removable, partially or totally, and which can be read by a computer or microprocessor storing instructions of a computer program, in which said information storage means implements a reception method according to claim 19.

56. A computer program product, comprising software code portions for implementing a sending method according to claim 1 or 2.

57. A computer program product, comprising software code portions for implementing a reception method according to claim 19.

58. A method for communicating, on a transmission channel, signals representing an original information sequence, the method comprising:

sending the original information sequence, including:

an encoding operation, of encoding the original information sequence by means of an error correction code, so as to obtain a sequence of encoded symbols, a frequency mapping operation, of associating with the sequence of encoded symbols K frequency symbols in a frequency space consisting of an ordered series of $2^p$ increasing frequencies, periodically spaced apart and associated with an amplitude, each of the K frequency symbols representing N encoded symbols, p, K and N being strictly positive integers, an inverse transformation operation, of applying to the K frequency symbols a reversible transformation including a multiplication by an invertible matrix of size N×N, so as to obtain inverse transform signals, and a transmission operation, of sending over a transmission channel signals obtained from the inverse transform signals in which there exists a K-tuplet of positive integers $n_1, n_2, \ldots, n_K$, at least one of which is strictly positive, such that, for an integer i varying from 1 to K, after periodic extraction of one frequency out of $2^{n_i}$ amongst the frequencies of the $i^{th}$ of the K frequency symbols, thus forming a reduced frequency symbol with $2^{p-n_i}$ frequencies, a set of K reduced frequency symbols is obtained, representing the original information sequence, with a view to a complete or partial decoding; and receiving the signals representing the original information sequence sent by said sending, in which, from a K-tuplet of granularity equal to positive integers $n'_1, n'_2, \ldots, n'_K$ such that each integer $n'_i$ is less than or equal to the integer $n_i$, said method includes:

an operation, of receiving the K frequency symbols sent by said sending, an extraction operation, for each integer i varying from 1 to K, of periodically extracting one frequency out of $2^{p-n'_i}$ amongst the frequencies of the $i^{th}$ of the K frequency symbols received, thus forming a reduced frequency symbol with $2^{p-n'_i}$ frequencies, a transformation operation, for each integer i varying from 1 to K, of applying to the reduced frequency symbol with $2^{p-n'_i}$ frequencies, a reversible transformation including a multiplication by an invertible matrix of size $2^{p-n'} \times 2^{p-n'}$, and an operation, of decoding all the K reduced frequency symbols with $2^{p-n'_i}$ frequencies, thus forming a decoded information sequence.

* * * * *

UNITED STATES PATENT AND TRADEMARK OFFICE
CERTIFICATE OF CORRECTION

| | | |
|---|---|---|
| PATENT NO. | : 7,190,730 B2 | Page 1 of 2 |
| APPLICATION NO. | : 09/785780 | |
| DATED | : March 13, 2007 | |
| INVENTOR(S) | : Frederique Ehrmann et al. | |

It is certified that error appears in the above-identified patent and that said Letters Patent is hereby corrected as shown below:

ON THE TITLE PAGE [12]:

United States Patent, "Ehrmann" should read --Ehrmann et al.--.

ON THE TITLE PAGE [56] REFERENCES CITED:

Other Publications, "Keller et al:" should read --Keller T et al:-- and "US., Conf." should read --US., vol. conf.--.

ON THE TITLE PAGE [75]:

Inventor, "Frederique Ehrmann, Rennes (FR)" should read --Frederique Ehrmann, Rennes (FR); Philippe Le Bars, Thorigne-Fouillard (FR); Samuel Rousselin, Rennes (FR); Francois Thoumy, Vignoc (FR); Lionel Le Scolan, Rennes (FR)--.

COLUMN 2:

Line 45, "ICC '93, Geneva." should read --ICC '93, Geneva--.

COLUMN 3:

Line 20, "signals; this" should read --signals; ¶ this--.

COLUMN 5:

Line 18, "over a" should read --over--.

COLUMN 9:

Line 39, "output the" should read --output of the--.

COLUMN 12:

Line 33, "over a" should read --over--.

UNITED STATES PATENT AND TRADEMARK OFFICE
CERTIFICATE OF CORRECTION

PATENT NO. : 7,190,730 B2
APPLICATION NO. : 09/785780
DATED : March 13, 2007
INVENTOR(S) : Frederique Ehrmann et al.

It is certified that error appears in the above-identified patent and that said Letters Patent is hereby corrected as shown below:

COLUMN 16:

Line 23, "over a" should read --over--.

COLUMN 17:

Line 44, "over a" should read --over--.

COLUMN 18:

Line 5, "length 1," should read --length $\ell$,--; and
Line 7, "to 41." should read --to $4\ell$.--.

COLUMN 21:

Line 20, "over a" should read --over--.

COLUMN 22:

Line 14, "of $2^{p-n'i}$" should read --$2^{n'i}$--.

Signed and Sealed this

Sixth Day of January, 2009

JON W. DUDAS
*Director of the United States Patent and Trademark Office*